United States Patent
Kihara (10) Patent No.: US 9,233,833 B2
(45) Date of Patent: Jan. 12, 2016

(54) MEMS ELEMENT AND OSCILLATOR

(71) Applicant: Seiko Epson Corporation, Tokyo (JP)

(72) Inventor: Ryuji Kihara, Matsumoto (JP)

(73) Assignee: Seiko Epson Corporation (JP)

( * ) Notice: Subject to any disclaimer, the term of this patent is extended or adjusted under 35 U.S.C. 154(b) by 64 days.

(21) Appl. No.: 14/031,143

(22) Filed: Sep. 19, 2013

(65) Prior Publication Data

US 2014/0091871 A1 Apr. 3, 2014

(30) Foreign Application Priority Data

Oct. 2, 2012 (JP) ................................. 2012-220083

(51) Int. Cl.
*H03H 9/24* (2006.01)
*H03B 5/30* (2006.01)
*B81B 3/00* (2006.01)
*H03H 9/02* (2006.01)

(52) U.S. Cl.
CPC ............... *B81B 3/0021* (2013.01); *H03B 5/30* (2013.01); *H03H 9/2457* (2013.01); *B81B 2201/0271* (2013.01); *B81B 2203/019* (2013.01); *B81B 2203/0118* (2013.01); *H03H 2009/02251* (2013.01); *H03H 2009/02488* (2013.01); *H03H 2009/02511* (2013.01)

(58) Field of Classification Search
CPC .......... H03H 9/02244; H03H 9/02291; H03H 9/02511; H03H 9/2457; H03H 2009/02488; H03H 2009/02251; H03H 2009/02511; H03H 2009/02291; H03B 5/30; B81B 3/0021; B81B 3/0086; B81B 2203/0118; B81B 2203/019; B81B 2203/053; B81B 2201/0271

USPC .................. 333/186, 197, 200; 331/154, 156, 331/116 R, 116 M

See application file for complete search history.

(56) References Cited

U.S. PATENT DOCUMENTS

| | | | |
|---|---|---|---|
| 6,433,657 B1 | 8/2002 | Chen | |
| 6,784,769 B1 | 8/2004 | Chen | |
| 7,705,693 B2 | 4/2010 | Davis | |
| 7,902,942 B2 * | 3/2011 | Hashimura | 333/186 |
| 7,907,025 B2 * | 3/2011 | Hashimura | 331/116 M |
| 8,026,120 B2 | 9/2011 | Kihara et al. | |
| 8,587,390 B2 * | 11/2013 | Kihara | 333/186 |
| 2003/0062961 A1 | 4/2003 | Ma et al. | |
| 2004/0113722 A1 * | 6/2004 | Bircumshaw et al. | 333/197 |
| 2005/0007219 A1 | 1/2005 | Ma et al. | |
| 2005/0046518 A1 * | 3/2005 | Zurcher et al. | 333/186 |

(Continued)

FOREIGN PATENT DOCUMENTS

JP  2010-162629 A  7/2010

*Primary Examiner* — Barbara Summons
(74) *Attorney, Agent, or Firm* — Harness, Dickey & Pierce, P.L.C.

(57) ABSTRACT

A MEMS element includes: a substrate; a first electrode formed above the substrate; and a second electrode having a support portion and a beam portion, the support portion being formed above the substrate, the beam portion extending from the support portion, being formed in a state of having a gap between the first electrode and the beam portion, and being capable of vibrating in a thickness direction of the substrate. The width of the beam portion decreases with distance from a base of the beam portion toward a tip of the beam portion. The central length of the beam portion is larger than the lengths of ends of the beam portion. The width of the base of the beam portion is larger than the central length of the beam portion.

6 Claims, 5 Drawing Sheets

(56) References Cited

U.S. PATENT DOCUMENTS

| | | | |
|---|---|---|---|
| 2007/0090897 A1* | 4/2007 | Tanaka | 333/189 |
| 2007/0091971 A1* | 4/2007 | Tanaka | 372/82 |
| 2007/0279140 A1 | 12/2007 | Davis | |
| 2009/0229648 A1 | 9/2009 | Makansi | |
| 2010/0090786 A1* | 4/2010 | Inaba et al. | 333/219 |
| 2010/0176898 A1 | 7/2010 | Kihara | |
| 2011/0050366 A1 | 3/2011 | Ayazi et al. | |
| 2011/0306153 A1 | 12/2011 | Kihara et al. | |
| 2011/0309891 A1* | 12/2011 | van der Avoort | 331/156 |
| 2012/0146736 A1 | 6/2012 | Kihara | |
| 2012/0249253 A1 | 10/2012 | Kihara | |
| 2012/0270352 A1* | 10/2012 | Huffman et al. | 438/50 |
| 2013/0168782 A1 | 7/2013 | Jahnes et al. | |

* cited by examiner

MEMS ELEMENT AND OSCILLATOR

BACKGROUND

1. Technical Field

The present invention relates to a MEMS element and an oscillator.

2. Related Art

MEMS (micro electro mechanical systems), which are one of techniques for forming a minute structure, mean a technique for making a micro electro mechanical system on the order of microns, or the product thereof, for example.

For example, U.S. Patent Application Publication No. 2007/0279140 discloses, as a MEMS element, a MEMS vibrator including a first electrode and a second electrode having a beam portion arranged with a gap between the first electrode and the beam portion. The MEMS vibrator disclosed in U.S. Patent Application Publication No. 2007/0279140 is a cantilever-like vibrator in which one end of the beam portion is fixed and the beam portion has a shape whose size in its width direction is larger than in its extension direction. By making the beam portion large in the width direction in this manner, an electrostatic force between the beam portion and the first electrode can be increased without changing a vibration frequency. When such a MEMS vibrator is used for an oscillator, it is desirable to cause the MEMS vibrator to oscillate at a frequency of the first vibration mode in view of an output signal, for example.

Figure 14:
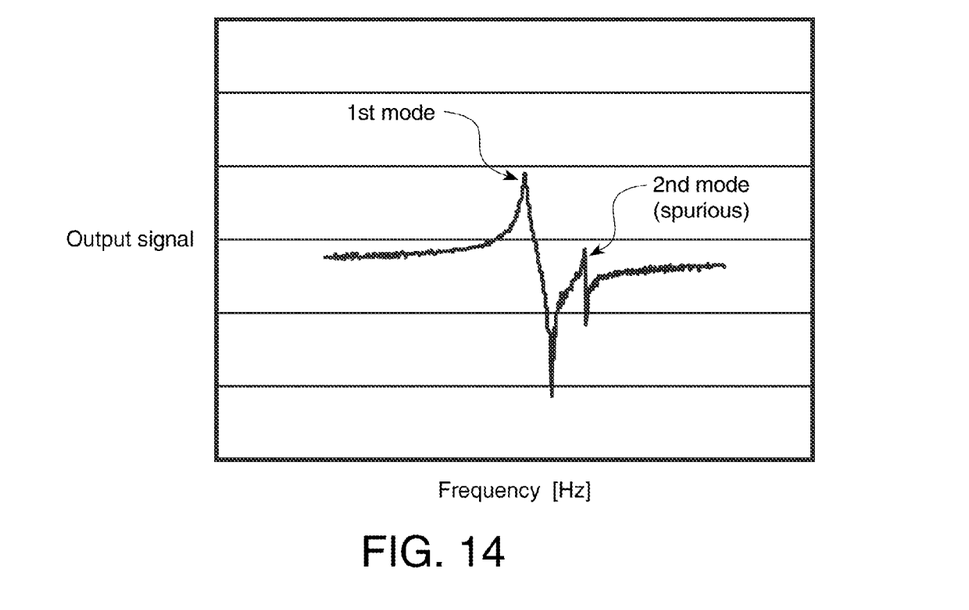
FIG. 14 is a graph showing a relation between frequencies and output signals.

On the other hand, the MEMS vibrator has a plurality of vibration modes, and the frequency of each of the vibration modes depends on the shape of the vibrator. When a vibrator is used as an oscillator in general, it is ideal that differences in frequency between a vibration mode to be used and other vibration modes are large. For example, in the case of using the first vibration mode as an oscillator, when a difference between a frequency of the first vibration mode and a frequency (spurious) of the second vibration mode is small as shown in FIG. 14, there is a problem in that the vibrator oscillates in an oscillation condition satisfied by the second vibration mode.

Especially in the case of the MEMS vibrator having the beam portion larger in the width direction than in the extension direction as described above, a difference in frequency between the first vibration mode and the second vibration mode is small. Therefore, oscillation is likely to occur at an unintended frequency.

SUMMARY

An advantage of some aspects of the invention is to provide a MEMS element in which other vibration modes can be distanced from the first vibration mode and which can be oscillated at a desired frequency. Moreover, another advantage of some aspects of the invention is to provide an oscillator including the MEMS element.

An aspect of the invention is directed to a MEMS element including: a substrate; a first electrode formed above the substrate; and a second electrode having a support portion and a beam portion, the support portion being formed above the substrate, the beam portion extending from the support portion, being formed in a state of having a gap between the first electrode and the beam portion, and being capable of vibrating in a thickness direction of the substrate, wherein the width of the beam portion decreases with distance from a base of the beam portion toward a tip of the beam portion, the central length of the beam portion is larger than the length of an end of the beam portion, and the width of the base of the beam portion is larger than the central length of the beam portion.

According to the MEMS element, differences in frequency between the first vibration mode and other vibration modes (the second vibration mode, the third vibration mode, and the like) can be increased (described in detail later). That is, the other vibration modes can be distanced from the first vibration mode. Due to this, oscillation is possible at a desired frequency, specifically, at a frequency of the first vibration mode.

It is noted that, in the descriptions concerning the invention, the term 'above' may be used, for example, in a manner as "a specific element (hereinafter referred to as 'A') is formed 'above' another specific element (hereinafter referred to as 'B')". In the case of such an example, the term 'above' is used, while assuming that it includes the case where A is formed directly on B, and the case where A is formed above B through another element.

The MEMS element according to the aspect of the invention may be configured such that the beam portion has a first part having a rectangular shape in plan view and the central length of the beam portion, and a second part adjacent to the first part and having the length of the end of the beam portion, and the length of the second part decreases with distance from the first part.

According to the MEMS element of this configuration, the other vibration modes can be distanced from the first vibration mode, and oscillation is possible at a desired frequency, specifically, at a frequency of the first vibration mode.

The MEMS element according to the aspect of the invention may be configured such that the second part has a trapezoidal shape in plan view.

According to the MEMS element of this configuration, the other vibration modes can be distanced from the first vibration mode, and oscillation is possible at a desired frequency, specifically, at a frequency of the first vibration mode.

The MEMS element according to the aspect of the invention may be configured such that the beam portion has an arc or elliptical-arc shape in plan view.

According to the MEMS element of this configuration, differences in frequency between the first vibration mode and the other vibration modes can be further increased. That is, the other vibration modes can be further distanced from the first vibration mode.

Another aspect of the invention is directed to an oscillator including: the MEMS element according to the aspect of the invention; and a circuit portion electrically connected with the first electrode and the second electrode of the MEMS element.

According to the oscillator, since the MEMS element according to the aspect of the invention is included, stable characteristics can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below do not unduly limit the contents of the invention set forth in the appended claims. Moreover, not all of the configurations described in the embodiments are necessarily indispensable components of the invention.

1. First Embodiment 1.1. MEMS Element

Figure 1:
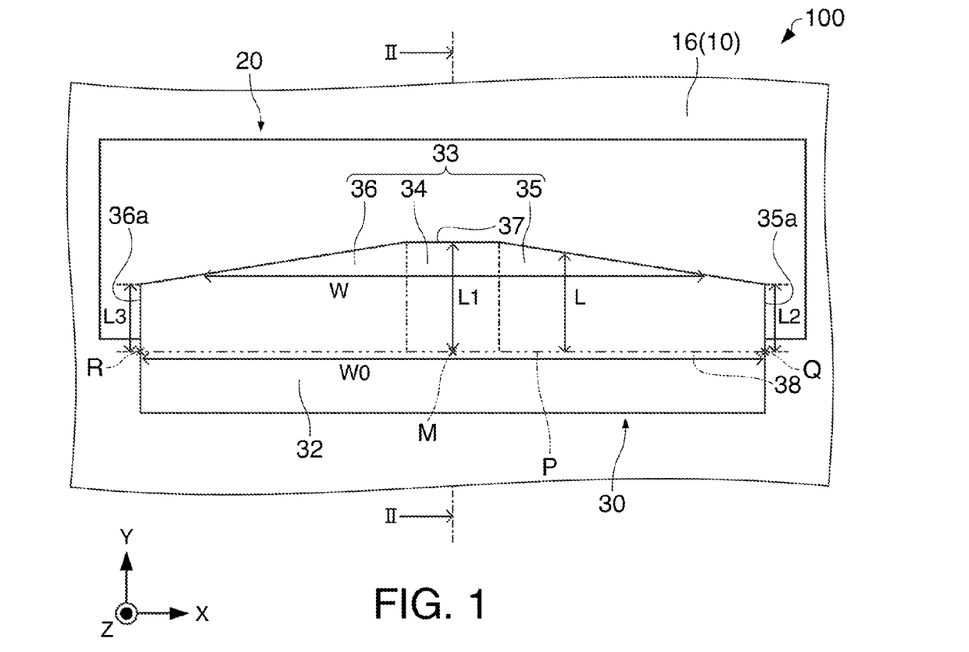
FIG. 1 is a plan view schematically showing a MEMS element according to a first embodiment.
Figure 2:
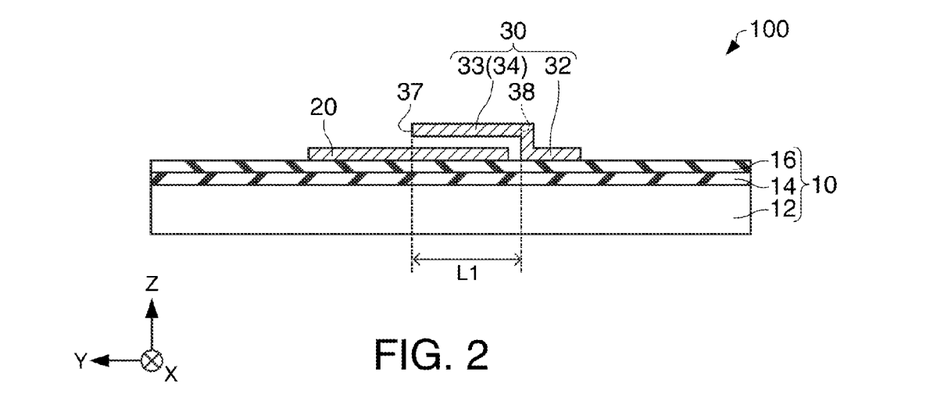
FIG. 2 is a cross-sectional view schematically showing the MEMS element according to the first embodiment.

First, a MEMS element according to a first embodiment will be described with reference to the drawings. FIG. 1 is a plan view schematically showing the MEMS element 100 according to the first embodiment. FIG. 2 is a cross-sectional view schematically showing the MEMS element 100 according to the first embodiment taken along line II-II in FIG. 1. In FIGS. 1 and 2, an X-axis, a Y-axis, and a Z-axis are shown as three axes perpendicular to each other.

Hereinafter, the MEMS element 100 will be described as a MEMS vibrator.

As shown in FIGS. 1 and 2, the MEMS element 100 includes a substrate 10, a first electrode 20, and a second electrode 30. The substrate 10 has a support substrate 12, a first under layer 14, and a second under layer 16.

As the support substrate 12, a semiconductor substrate such as a silicon substrate, for example, is used. As the support substrate 12, various types of substrates such as a ceramics substrate, a glass substrate, a sapphire substrate, a diamond substrate, and a synthetic resin substrate may be used.

The first under layer 14 is formed on the support substrate 12. As the first under layer 14, a LOCOS (local oxidation of silicon) insulating layer, a semi-recessed LOCOS insulating layer, or a trench insulating layer, for example, is used. The first under layer 14 can electrically isolate the first electrode 20 and the second electrode 30 from another element (for example, a transistor (not shown)).

The second under layer 16 is formed on the first under layer 14. As the second under layer 16, a silicon nitride layer, for example, is used. The second under layer 16 can function as an etching stopper layer in a release step described later.

The first electrode 20 is formed on the substrate 10. The shape of the first electrode 20 is, for example, layer-like. In the illustrated example, the first electrode 20 has a rectangular shape in plan view (as viewed from a thickness direction of the substrate 10; as viewed from a Z-axis direction in the illustrated example).

The second electrode 30 is formed on the substrate 10 spaced apart from the first electrode 20. The shape of the second electrode 30 is, for example, layer-like. The second electrode 30 has a support portion 32 and a beam portion 33.

The support portion 32 is formed on the substrate 10. The support portion 32 supports the beam portion 33. In the illustrated example, the support portion 32 has an oblong shape in plan view.

The beam portion 33 extends from the support portion 32. In the illustrated example, the beam portion 33 extends in a positive Y-axis direction from the support portion 32. The beam portion 33 is formed in a state of having a gap between the beam portion 33 and the first electrode 20. The beam portion 33 is arranged to face the first electrode 20. The beam portion 33 can vibrate in the thickness direction (the Z-axis direction in the illustrated example) of the substrate 10 with an electrostatic force between the beam portion 33 and the first electrode 20. The MEMS element 100 is a cantilever-like vibrator.

Hereinafter, the size of the beam portion 33 in a direction from a base 38 toward a tip 37 (a Y-axis direction in the illustrated example) is defined as a length L, while the size of the beam portion 33 in a direction perpendicular to the direction from the base 38 toward the tip 37 (an X-axis direction in the illustrated example) is defined as a width W.

The width W of the beam portion 33 decreases with distance from the base 38 of the beam portion 33 toward the tip 37 of the beam portion 33 (toward the positive Y-axis direction in the illustrated example).

In the embodiment, the sentence "width W of the beam portion 33 decreases with distance from the base 38 of the beam portion 33 toward the tip 37 of the beam portion 33" means that the beam portion 33 may include a region where the width W does not change from the base 38 toward the tip 37. That is, as shown in FIG. 1, the beam portion 33 may be configured to include a region where the width W continuously changes (monotonically decreases) toward the positive Y-axis direction and a region where the width W does not change toward the positive Y-axis direction. Although not illustrated, the width W of the beam portion 33 may change in a stepwise manner toward the positive Y-axis direction.

A central length L1 of the beam portion 33 is larger than a length L2 of an end 35a of the beam portion 33 and larger than a length L3 of an end 36a of the beam portion 33. The central length L1 of the beam portion 33 is the maximum length in the beam portion 33.

In the illustrated example, the central length L1 of the beam portion 33 is a distance from a midpoint M of a border line P between the beam portion 33 and the support portion 32 to the tip 37 of the beam portion 33. The border line P is a line parallel to the X-axis and connecting points Q and R that are in contact with an outer edge of the second electrode 30 in plan view. The midpoint M is a point equally distanced from the points Q and R. The beam portion 33 may be symmetrical with respect to an axis (not shown) passing through the point M and parallel to the Y-axis.

The length L2 of the end 35a of the beam portion 33 is a distance from the point Q to the tip 37. In the illustrated example, the end 35a is an end of the beam portion 33 in a positive X-axis direction. The length L3 of the end 36a of the beam portion 33 is a distance from the point R to the tip 37. In the illustrated example, the end 36a is an end of the beam portion 33 in a negative X-axis direction.

A width W0 of the base 38 of the beam portion 33 is larger than the central length L1 of the beam portion 33. The width W0 of the base 38 of the beam portion 33 is the maximum width in the beam portion 33. In the illustrated example, the width W0 of the base 38 of the beam portion 33 is the same as the width of the support portion 32.

The beam portion 33 has a first part 34 and second parts 35 and 36. The first part 34 has a rectangular (right-angled quadrilateral) shape in plan view. The first part 34 has the central length L1 of the beam portion 33.

The second part 35 is adjacent to the first part 34. In the illustrated example, the second part 35 is located in the positive X-axis direction of the first part 34. The length L of the second part 35 decreases with distance from the first part 34 (toward the positive X-axis direction in the illustrated example). The length L of the second part 35 continuously changes (monotonically decreases) with distance from the first part 34.

The second part 35 has a trapezoidal shape in plan view. The second part 35 has the length L2 of the end 35a of the beam portion 33. Specifically, the length L2 of the end 35a of the beam portion 33 is the length of one of the bases of the second part 35.

The second part 36 is adjacent to the first part 34. In the illustrated example, the second part 36 is located in the negative X-axis direction of the first part 34. The length L of the second part 36 decreases with distance from the first part 34 (toward the negative X-axis direction in the illustrated example). The length L of the second part 36 continuously changes (monotonically decreases) with distance from the first part 34.

The second part 36 has a trapezoidal shape in plan view. The second part 36 has the length L3 of the end 36a of the beam portion 33. Specifically, the length L3 of the end 36a of the beam portion 33 is the length of one of the bases of the second part 36.

The material of the first electrode 20 and the second electrode 30 is, for example, polycrystalline silicon doped with a predetermined impurity to provide conductivity. When a voltage is applied between the first electrode 20 and the second electrode 30, the beam portion 33 can vibrate in the thickness direction of the substrate 10 with an electrostatic force generated between the first electrode 20 and the second electrode 30.

Although not illustrated, the MEMS element 100 may have a covering structure that airtightly seals the first electrode 20 and the second electrode 30 in a reduced-pressure state. Due to this, air resistance in vibration of the beam portion 33 can be decreased.

The MEMS element according to the embodiment of the invention can be used as, for example, various types of sensors such as a gyro sensor and an acceleration sensor, in addition to a vibrator.

The MEMS element 100 according to the first embodiment has, for example, the following features.

According to the MEMS element 100, the width W of the beam portion 33 decreases with distance from the base 38 of the beam portion 33 toward the tip 37 of the beam portion 33; and the central length L1 of the beam portion 33 is larger than the lengths L2 and L3 of the ends 35a and 36a of the beam portion 33. Therefore, the MEMS element 100 can increase differences in frequency between the first vibration mode and other vibration modes (the second vibration mode, the third vibration mode, and the like) (described in detail later). That is, the other vibration modes can be distanced from the first vibration mode. Due to this, oscillation is possible at a desired frequency, specifically, at a frequency of the first vibration mode.

For example, when the central length of the beam portion is the same as the length of the end of the beam portion, flexure occurs at the end of the beam portion, which sometimes decreases a difference in frequency between the first vibration mode and the second vibration mode.

Further, in the MEMS element 100, the width W0 of the base 38 of the beam portion 33 is larger than the central length L1 of the beam portion 33. A vibration frequency f of a cantilever-like vibrator is expressed by the following equation (1). As shown by the equation (1), the vibration frequency f depends on the length L (specifically, the maximum length L1 of the beam portion) of the beam portion, but does not depend on the width of the beam portion. Hence, in the MEMS element 100, the area (area in plan view) of the beam portion 33 can be increased without changing the vibration frequency f by making the width W0 of the base 38 of the beam portion 33 larger than the length L1. Due to this, an electrostatic force between the electrodes 20 and 30 can be increased. In the equation (1), E represents the Young's modulus of the beam portion 33; ρ represents the density of the beam portion 33; and t represents the thickness of the beam portion 33.

$$f = \frac{1}{2\pi}\sqrt{\frac{35E}{33\rho}}\frac{t}{L^2} \quad (1)$$

According to the MEMS element 100, the first part 34 has the central length L1 of the beam portion 33; the second parts 35 and 36 have the lengths L2 and L3 of the ends 35a and 36a of the beam portion 33; and the length L of the second part decreases with distance from the first part 34. Further, the first part 34 has a rectangular shape in plan view, while the second parts 35 and 36 each have a trapezoidal shape in plan view. Therefore, the area of the beam portion 33 can be increased in the MEMS element 100, compared to, for example, a MEMS element having an arc-like beam portion where the maximum length of the beam portion is the same and the maximum width of the beam portion is the same. Due to this, in the MEMS element 100, an electrostatic force between the first electrode 20 and the second electrode 30 can be increased.

1.2. Method for Manufacturing MEMS Element

Figure 3:
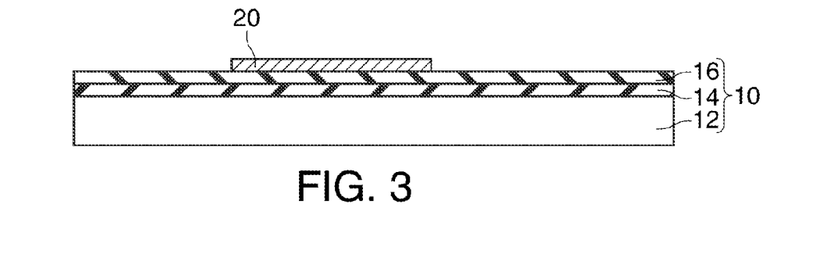
FIG. 3 is a cross-sectional view schematically showing a manufacturing step of the MEMS element according to the first embodiment.
Figure 4:
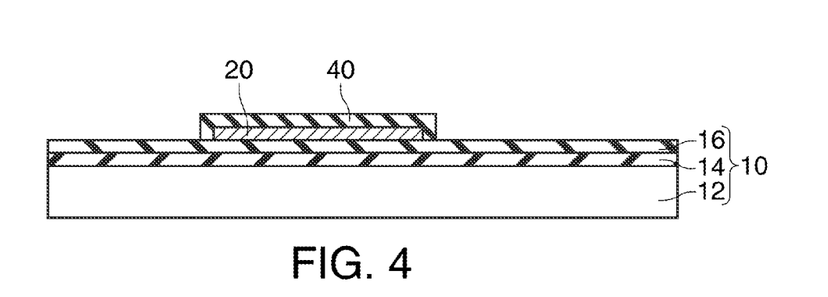
FIG. 4 is a cross-sectional view schematically showing a manufacturing step of the MEMS element according to the first embodiment.
Figure 5:
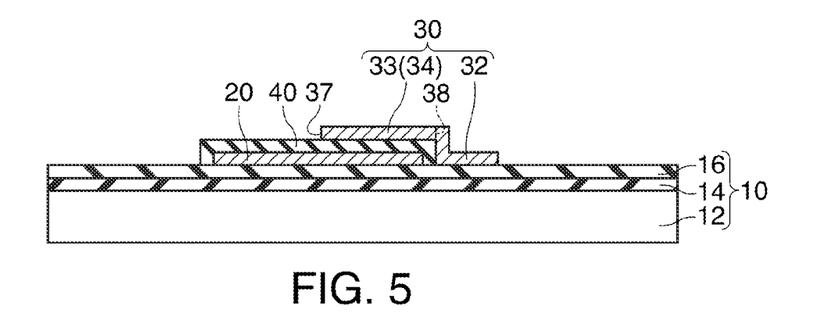
FIG. 5 is a cross-sectional view schematically showing a manufacturing step of the MEMS element according to the first embodiment.

Next, a method for manufacturing the MEMS element 100 according to the first embodiment will be described with reference to the drawings. FIGS. 3 to 5 are cross-sectional views each schematically showing a manufacturing step of the MEMS element 100 according to the first embodiment.

As shown in FIG. 3, the first under layer 14 is formed on the support substrate 12. The first under layer 14 is formed by, for example, a LOCOS method or an STI (shallow trench isolation) method. Next, the second under layer 16 is formed on the first under layer 14. The second under layer 16 is formed by, for example, a CVD (chemical vapor deposition) method or a sputtering method. Through the steps described above, the substrate 10 can be formed.

Next, the first electrode 20 is formed on the substrate 10. Specifically, the first electrode 20 is formed by deposition by a CVD method, a sputtering method, or the like and then by patterning using a photolithographic technique and an etching technique. When the first electrode 20 is made of polycrystalline silicon, polycrystalline silicon is doped with a predetermined impurity to provide conductivity.

As shown in FIG. 4, a sacrificial layer 40 is formed so as to cover the first electrode 20. The sacrificial layer 40 is formed by, for example, thermally oxidizing the first electrode 20. The material of the sacrificial layer 40 is, for example, silicon oxide.

As shown in FIG. 5, the second electrode 30 is formed on the sacrificial layer 40 and the substrate 10. Specifically, the second electrode 30 is formed by deposition by a CVD method, a sputtering method, or the like and then by patterning using a photolithographic technique and an etching technique. When the second electrode 30 is made of polycrystalline silicon, polycrystalline silicon is doped with a predetermined impurity to provide conductivity.

As shown in FIG. 1, the sacrificial layer 40 is removed (release step). The removal of the sacrificial layer 40 is performed by, for example, wet etching using hydrofluoric acid, buffered hydrofluoric acid (a mixture of hydrofluoric acid and ammonium fluoride), or the like. In the release step, the second under layer 16 can function as an etching stopper layer.

Through the steps described above, the MEMS element 100 can be manufactured.

1.3. Simulation

Next, simulations in which the beam portion 33 of the MEMS element 100 according to the first embodiment was modeled will be described with reference to the drawings. The simulations were performed using I-DEAS (manufactured by Siemens PLM Software).

1.3.1. Configuration of Model

Figure 6:
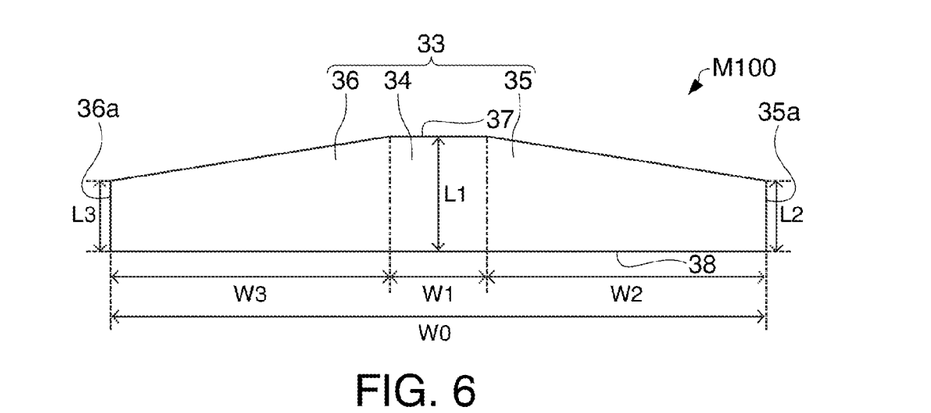
FIG. 6 is a plan view schematically showing a model according to Example 1 used in a simulation.

FIG. 6 is a plan view schematically showing a model M100 used in a simulation as Example 1. The model M100 corresponds to the beam portion 33 of the MEMS element 100 (refer to FIG. 1). In FIG. 6, portions of the model M100 corresponding to those of the beam portion 33 of the MEMS element 100 are denoted by the same reference numerals and signs.

In the model M100, in plan view as shown in FIG. 6, the first part 34 was made into an oblong shape, while the second parts 35 and 36 were each made into a trapezoidal shape. In the model M100, the length (central length of the beam portion 33) L1 of the first part 34 is 3.7875 µm; and the length L2 of the end 35a of the beam portion 33 and the length L3 of the end 36a are each 2.535 µm. Moreover, the width W0 of the base 38 of the beam portion 33 is 30 µm; a width W1 of the first part 34 is 6 µm; and a width W2 of the second part 35 and a width W3 of the third part are each 12 µm.

Figure 7:
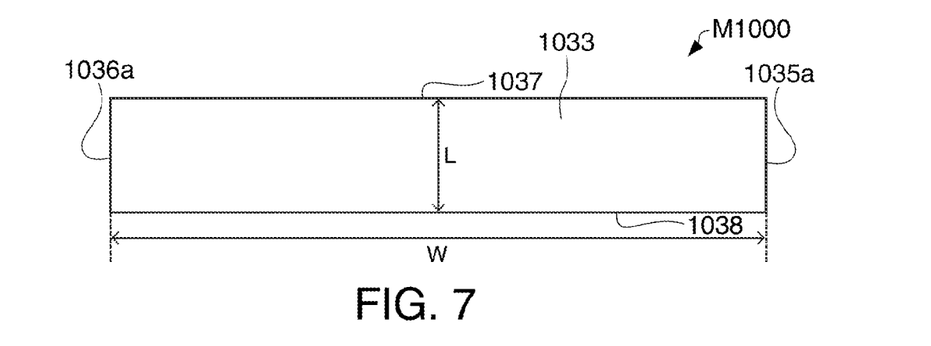
FIG. 7 is a plan view schematically showing a model according to a comparative example used in a simulation.

FIG. 7 is a plan view schematically showing a model M1000 used in a simulation as a comparative example.

In the model M1000, a beam portion 1033 was made into an oblong shape in plan view as shown in FIG. 7. In the model M1000, a length (distance from a base 1038 to a tip 1037) L is 3.7875 µm; and a width (distance from an end 1035a to an end 1036a) W is 30 µm.

In the models M100 and M1000, the thickness is 0.3 µm; the Young's modulus is 123.2 GPa; the density is 2230 kg/m$^3$; and the Poisson ratio is 0.22.

The models M100 and M1000 described above were caused to vibrate in a state where the bases 38 and 1038 were fixed, and differences in frequency between the first vibration mode and other vibration modes were obtained.

1.3.2. Simulation Result

Figure 8:
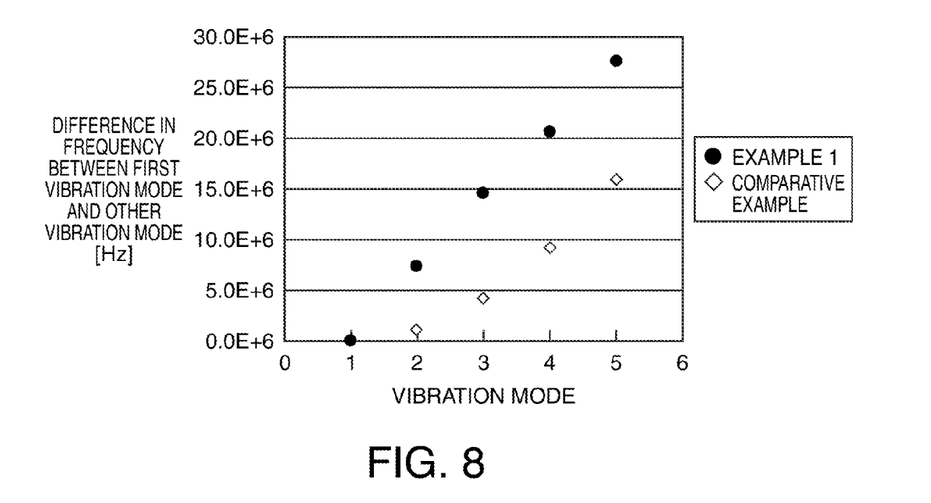
FIG. 8 is a graph showing a relation between vibration modes and differences in frequency between the first vibration mode and other vibration modes.

FIG. 8 is a graph showing the results of the simulations. In FIG. 8, the horizontal axis represents the vibration mode, while the vertical axis represents the difference in frequency between the first vibration mode and the other vibration modes. That is, FIG. 8 shows the differences in frequency between the first vibration mode and the other vibration modes (the second to fifth vibration modes). For example, in the model M100 according to Example 1, a difference in frequency between the first vibration mode and the second vibration mode is 7.4 MHz. In the model M1000 according to the comparative example, a difference infrequency between the first vibration mode and the second vibration mode is 1.1 MHz.

It is found from FIG. 8 that the differences in frequency between the first vibration mode and the other vibration modes are large in the model M100 according to Example 1 compared to the model M1000 according to the comparative example. Hence, it can be said that the other vibration modes can be distanced from the first vibration mode in the MEMS element 100, and that the MEMS element 100 can be oscillated at a desired frequency, specifically, at a frequency of the first vibration mode.

2. Second Embodiment 2.1. MEMS Element

Figure 9:
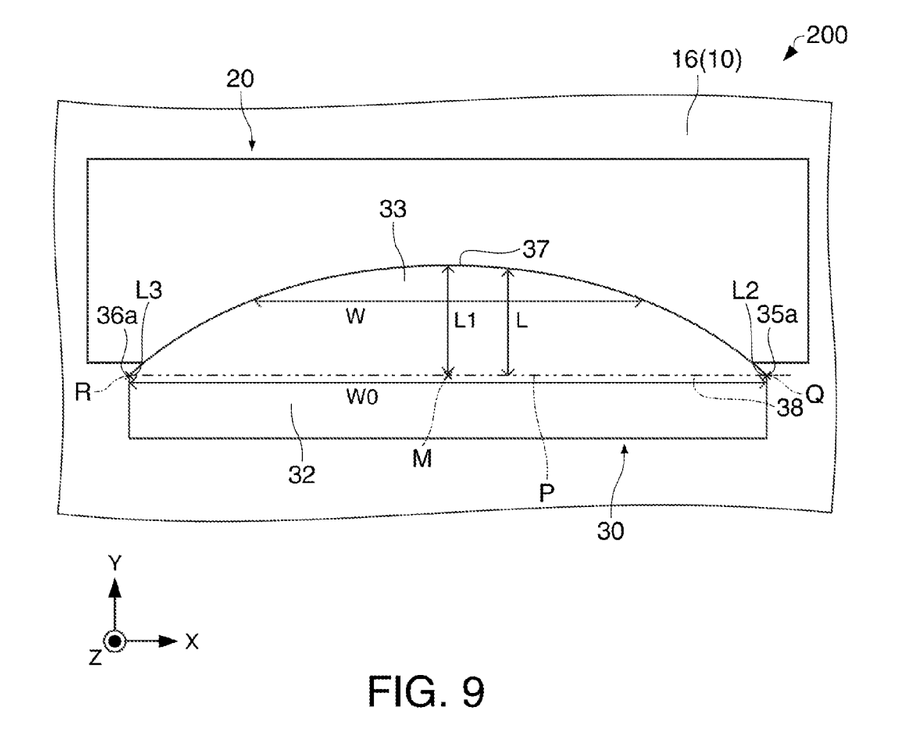
FIG. 9 is a plan view schematically showing a MEMS element according to a second embodiment.

Next, a MEMS element according to a second embodiment will be described with reference to the drawings. FIG. 9 is a plan view schematically showing the MEMS element 200 according to the second embodiment. In FIG. 9, the X-axis, the Y-axis, and the Z-axis are shown as three axes perpendicular to each other. In the MEMS element 200 according to the second embodiment described below, members having a similar function to that of the constituent member of the MEMS element 100 according to the first embodiment are denoted by the same reference numeral and sign, and the detailed description thereof is omitted.

In the MEMS element 100 as shown in FIG. 1, the beam portion 33 has the first part 34 of a rectangular shape in plan view and the second parts 35 and 36 of a trapezoidal shape in plan view. In contrast to this, in the MEMS element 200, the beam portion 33 has an arc shape in plan view as shown in FIG. 9.

In the MEMS element 200, the end 35a of the beam portion 33 may overlap the point Q. The end 36a of the beam portion 33 may overlap the point R. In the MEMS element 200, the central length L1 of the beam portion 33 is larger than the lengths L2 and L3 of the ends 35a and 36a of the beam portion 33 similarly to the MEMS element 100.

According to the MEMS element 200, compared to the MEMS element 100, the differences in frequency between the first vibration mode and the other vibration modes can be further increased (described in detail later). That is, the other vibration modes can be further distanced from the first vibration mode. Due to this, oscillation is possible at a desired frequency, specifically, at a frequency of the first vibration mode.

The beam portion 33 of the MEMS element 200 may have an elliptical-arc shape in plan view.

2.2. Method for Manufacturing MEMS Element

Next, a method for manufacturing the MEMS element 200 according to the second embodiment will be described. The method for manufacturing the MEMS element 200 according to the second embodiment is basically the same as that of the MEMS element 100 according to the first embodiment. Hence, the description thereof is omitted.

2.3. Simulation

Next, simulations in which the beam portion 33 of the MEMS element 200 according to the second embodiment was modeled will be described with reference to the drawings. In the simulations in which the beam portion 33 of the MEMS element 200 was modeled, differences from the simulation example in which the beam portion 33 of the MEMS element 100 was modeled are described below, and the description of similarities is omitted.

2.3.1. Configuration of Model

Figure 10:
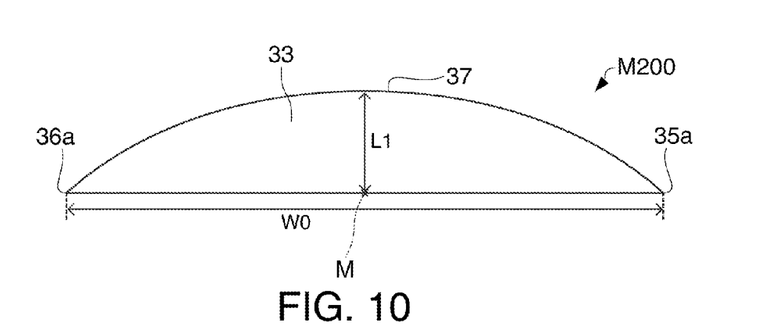
FIG. 10 is a plan view schematically showing a model according to Example 2 used in a simulation.

FIG. 10 is a plan view schematically showing a model M200 used in a simulation as Example 2. The model M200 corresponds to the beam portion 33 of the MEMS element 200 (refer to FIG. 9). In FIG. 10, portions of the model M200 corresponding to those of the beam portion 33 of the MEMS element 200 are denoted by the same reference numerals and signs.

In the model M200, the beam portion 33 was made into an arc shape in plan view as shown in FIG. 10. In the model M100, the central length L1 of the beam portion 33 is 3.7875 µm; and the width W0 of the base 38 of the beam portion 33 is 30 µm.

The model M1000 described above (refer to FIG. 7) was used as a comparative example.

2.3.2. Simulation Result

Figure 11:
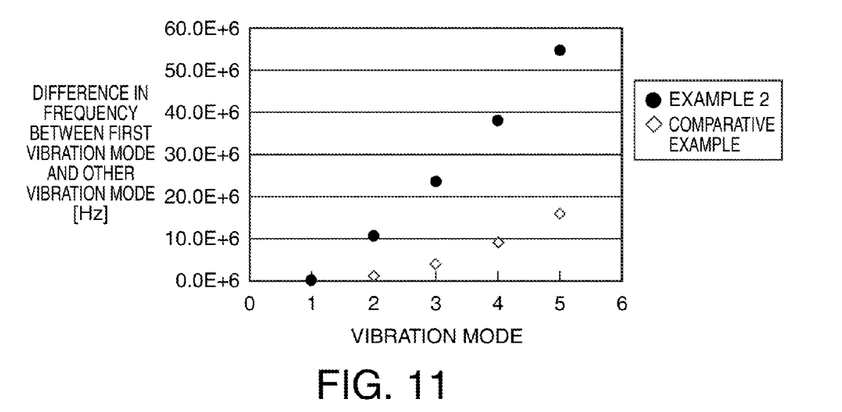
FIG. 11 is a graph showing a relation between vibration modes and differences in frequency between the first vibration mode and other vibration modes.

FIG. 11 is a graph showing the results of the simulations. In FIG. 11, the horizontal axis represents the vibration mode, while the vertical axis represents the difference in frequency between the first vibration mode and other vibration modes.

It is found from FIG. 11 that the differences in frequency between the first vibration mode and the other vibration modes are large in the model M200 according to Example 2 compared to the model M1000 according to the comparative example. Further, it is found from FIGS. 8 and 11 that the differences in frequency between the first vibration mode and the other vibration modes are large in the model M200 compared to the model M100. Hence, the MEMS element 200 can further increase the differences in frequency between the first vibration mode and the other vibration modes compared to the MEMS element 100 (the other vibration modes can be further distanced from the first vibration mode), so that oscillation is possible at a desired frequency, specifically, at a frequency of the first vibration mode.

3. Third Embodiment

Figure 12:
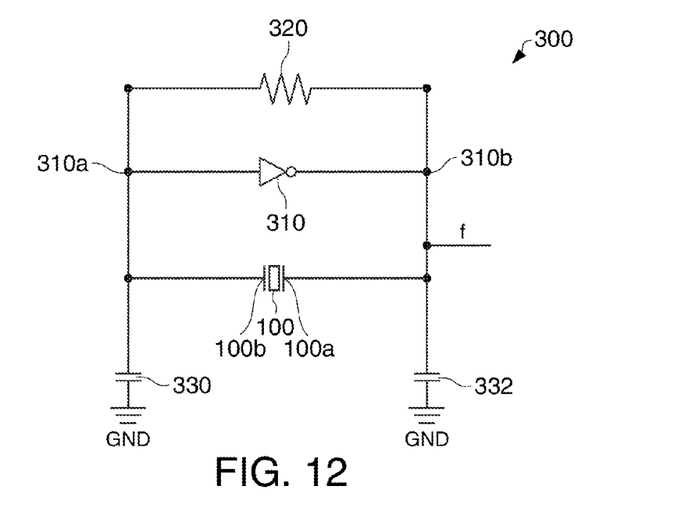
FIG. 12 is a circuit diagram showing an oscillator according to a third embodiment.

Next, an oscillator according to a third embodiment will be described with reference to the drawings. FIG. 12 is a circuit diagram showing the oscillator 300 according to the third embodiment.

As shown in FIG. 12, the oscillator 300 includes, for example, the MEMS element (for example, the MEMS element 100 as a MEMS vibrator) according to the embodiment of the invention and an inverting amplifier circuit (circuit portion) 310.

The MEMS element 100 has a first terminal 100a electrically connected with the first electrode 20 and a second terminal 100b electrically connected with the second electrode 30. The first terminal 100a of the MEMS element 100 is at least AC-connected with an output terminal 310b of the inverting amplifier circuit 310. The second terminal 100b of the MEMS element 100 is at least AC-connected with an input terminal 310a of the inverting amplifier circuit 310.

In the illustrated example, the inverting amplifier circuit 310 is composed of one inverter. However, the inverting amplifier circuit 310 may be composed of a combination of a plurality of inverters (inverting circuits) and amplifier circuits so as to satisfy a desired oscillation condition.

The oscillator 300 may be configured to include a feedback resistance for the inverting amplifier circuit 310. In the example shown in FIG. 12, the input and output terminals of the inverting amplifier circuit 310 are connected via a resistance 320.

The oscillator 300 is configured to include a first capacitor 330 connected between the input terminal 310a of the inverting amplifier circuit 310 and a reference potential (ground potential) and a second capacitor 332 connected between the output terminal 310b of the inverting amplifier circuit 310 and the reference potential (ground potential). This can form an oscillator circuit in which the MEMS element 100 and the capacitors 330 and 332 constitute a resonant circuit. The oscillator 300 outputs an oscillation signal f obtained by this oscillator circuit.

Elements (not shown) such as transistors or capacitors constituting the oscillator 300 may be formed on, for example, the support substrate 12 (refer to FIG. 2). Due to this, the MEMS element 100 and the inverting amplifier circuit 310 can be monolithically formed.

When the elements such as transistors constituting the oscillator 300 are formed on the support substrate 12, the elements such as transistors constituting the oscillator 300 may be formed in the same step as that of forming the MEMS element 100 described above. Specifically, in the step of forming the sacrificial layer 40 (refer to FIG. 4), a gate insulating layer of transistors may be formed. Further, in the step of forming the second electrode 30 (refer to FIG. 5), gate electrodes of the transistors may be formed. In this manner, the manufacturing steps are commonly used in the MEMS element 100 and the elements such as transistors constituting the oscillator 300, whereby the manufacturing steps can be simplified.

According to the oscillator 300, the MEMS element 100 in which the other vibration modes can be distanced from the first vibration mode and which can be oscillated at a desired frequency, specifically, at a frequency of the first vibration mode is included. Therefore, the oscillator 300 can have stable characteristics.

Figure 13:
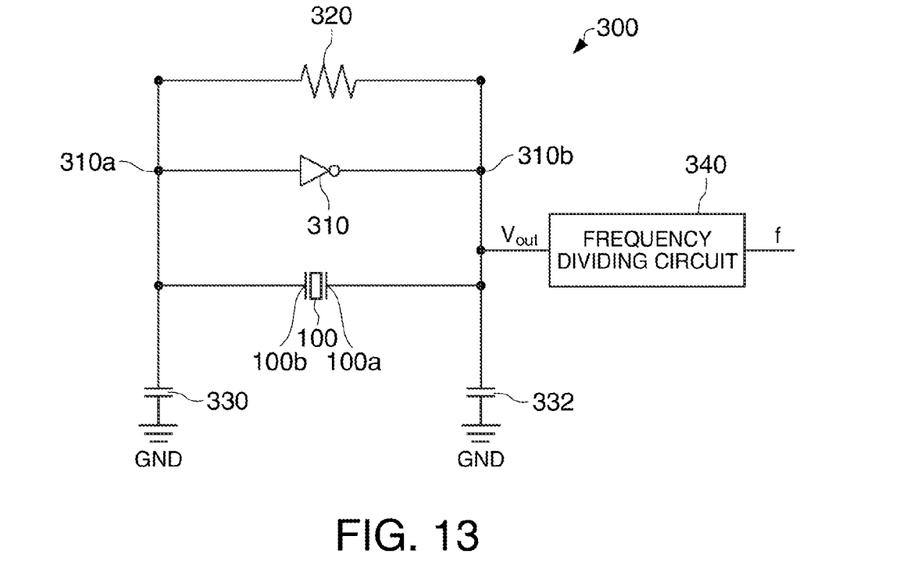
FIG. 13 is a circuit diagram showing an oscillator according to a modified example of the third embodiment.

As shown in FIG. 13, the oscillator 300 may further have a frequency dividing circuit 340. The frequency dividing circuit 340 frequency-divides an output signal $V_{out}$ of the oscillator circuit and outputs the oscillation signal f. Due to this, the oscillator 300 can obtain, for example, an output signal at a frequency lower than that of the output signal $V_{out}$.

The invention includes a configuration (for example, a configuration having the same function, method, and result, or a configuration having the same advantage and effect) which is substantially the same as those described in the embodiments. Moreover, the invention includes a configuration in which a non-essential portion of the configurations described in the embodiments is replaced. Moreover, the invention includes a configuration providing the same operational effects as those described in the embodiments, or a configuration capable of achieving the same advantages. Moreover, the invention includes a configuration in which a publicly known technique is added to the configurations described in the embodiments.

The entire disclosure of Japanese Patent Application No. 2012-220083, filed Oct. 2, 2012 is expressly incorporated by reference herein.

What is claimed is:

1. A MEMS element comprising:
a substrate;
a first electrode formed above the substrate; and
a second electrode having a support portion and a beam portion, the support portion being formed above the substrate, the beam portion extending from the support portion, being formed in a state of having a gap between the first electrode and the beam portion, and being capable of vibrating in a thickness direction of the substrate, wherein the width of the beam portion decreases with distance from a base of the beam portion toward a tip of the beam portion, the central length of the beam portion is larger than the length of an end of the beam portion, the width of the base of the beam portion is larger than the central length of the beam portion, and the beam portion includes:
  a first part having a rectangular shape in plan view and the central length of the beam portion, and
  a second part adjacent to the first part and having the length of the end of the beam portion, wherein
    the length of the second part decreases with distance from the first part.

2. The MEMS element according to claim 1, wherein the second part has a trapezoidal shape in plan view.

3. An oscillator comprising:
the MEMS element according to claim 2, and
a circuit portion electrically connected with the first electrode and the second electrode of the MEMS element.

4. An oscillator comprising:
the MEMS element according to claim 1, and
a circuit portion electrically connected with the first electrode and the second electrode of the MEMS element.

5. A MEMS element comprising:
a substrate;
a first electrode formed above the substrate; and
a second electrode having a support portion and a beam portion, the support portion being formed above the substrate, the beam portion extending from the support portion, being formed in a state of having a gap between the first electrode and the beam portion, and being capable of vibrating in a thickness direction of the substrate, wherein the width of the beam portion decreases with distance from a base of the beam portion toward a tip of the beam portion, the central length of the beam portion is larger than the length of an end of the beam portion, the width of the base of the beam portion is larger than the central length of the beam portion, and the beam portion includes:
  a first part having the central length of the beam portion, and
  a second part adjacent to the first part and having the length of the end of the beam portion, wherein
    the length of the second part decreases with distance from the first part, and
    the beam portion has only one continuous arc or elliptical-arc shape in plan view.

6. An oscillator comprising:
the MEMS element according to claim 5, and
a circuit portion electrically connected with the first electrode and the second electrode of the MEMS element.

* * * * *